United States Patent [19]

Shimizu

[11] 3,869,622

[45] Mar. 4, 1975

[54] LOGIC GATE CIRCUIT INCLUDING A SCHOTTKY BARRIER DIODE

[75] Inventor: Kyozo Shimizu, Tokyo, Japan

[73] Assignee: Nippon Electric Company, Limited, Tokyo, Japan

[22] Filed: Sept. 8, 1972

[21] Appl. No.: 287,447

[30] Foreign Application Priority Data

Sept. 10, 1971 Japan .............................. 46-69703

[52] U.S. Cl. ................. 307/213, 307/215, 307/303, 357/15, 357/46, 357/48, 357/51

[51] Int. Cl. ........................................... H01l 19/00

[58] Field of Search ..... 317/235 UA, 235 D, 235 E; 307/213, 303

[56] References Cited

UNITED STATES PATENTS

| | | | |
|---|---|---|---|
| 3,138,744 | 6/1964 | Kilby | 307/213 |
| 3,256,587 | 6/1966 | Hangstefer | 307/213 |
| 3,274,398 | 9/1966 | Silverberg | 307/213 |
| 3,416,049 | 12/1968 | Bohn et al. | 317/235 |
| 3,573,490 | 4/1971 | Sevin, Jr. et al. | 317/235 UA |
| 3,623,925 | 11/1971 | Jenkins et al. | 317/235 UA |
| 3,654,530 | 4/1972 | Lloyd | 307/303 |

OTHER PUBLICATIONS

Intel LSI Product Guide, August, 1971 (Intel Corp., Santa Clara, Calif.), page 1.

Hibberd, Integrated Circuits, ti Electronics Series, McGraw-Hill, 1969; pages 75–79, 'digital logic-circuit families.'

Hibberd, Integrated Circuits, pages 40–41.

IBM Technical Disclosure Bulletin, Vol. 14, No. 4, Sept. 1971, "Integrated Circuits Having Reduced Parasitic Tbyrotron Effects" by G. J. Hadamard, pages 1075, 1076.

*Primary Examiner*—Andrew J. James
*Assistant Examiner*—William D. Larkins
*Attorney, Agent, or Firm*—Hopgood, Calimafde, Kalil

[57] ABSTRACT

A logic gate circuit that is highly suitable for incorporation in a large scale integrated circuit includes a transistor having a base electrode connected to the input terminal, an emitter electrode connected to a voltage source, and a collector electrode. A Schottky barrier diode is connected between the collector electrode and the output terminal.

3 Claims, 8 Drawing Figures

LOGIC GATE CIRCUIT INCLUDING A SCHOTTKY BARRIER DIODE

This invention relates generally to logic gate circuits, and more particularly to a logic gate circuit that is highly suited for large scale integrated circuits.

Many designs have been heretofore proposed to incorporate basic logic gate circuit elements in high packing densities with conventional integrated circuits. For instance, efforts have been directed toward reducing the number of circuit elements constituting a logic gate, or in the area occupied by each circuit element in the fabrication of integrated circuits. With large scale integrated (LSI) circuits, these requirements are much more severe than with conventional integrated circuits. If the logic gate circuit used in conventional integrated circuits were to be applied without modification for large scale integration, there would be no improvement in performance or reduction in fabrication costs. In order to realize proper LSI's that include logic gate circuits, it is necessary to provide a logic gate circuit design that reduces the number of circuit elements per gate, lowers power dissipation, and the like. Such a design has, however, heretofore eluded the art.

It is an object of this invention to provide a new and improved basic logic gate adapted for LSI, wherein the number of circuit elements is reduced, and each basic logic gate can be formed within one or at most two isolated areas.

It is another object of this invention to provide a simple and compact basic logic gate circuit which is featured by low power dissipation, high switching speeds, and eminent adaptability for LSI with high yield and low cost of fabrication.

The basic logic circuit of the invention comprises a transistor and an impedance element, one end of which is connected to the base of the transistor. A Schottky barrier diode is connected to the collector of the transistor such that a current passes therethrough in the same direction as the collector current. The other end of the impedance element is connected to a power source and the emitter of the transistor is connected to a reference voltage such as ground. The base of the transistor is used as an input terminal, and the other end of the Schottky barrier diode is used as an output terminal. The collector of the transistor has a terminal which can be used as an OR terminal.

Other Schottky barrier diodes may be connected to the collector of the transistor in parallel with and in the same manner as the above-mentioned Schottky barrier diode, thereby increasing the number of output terminals or fan-out of the logic circuit. The collector of the transistor may be connected through a second impedance element to the other end of the first-mentioned impedance. The second impedance element is preferably of a higher impedance than the first-mentioned impedance element, in order to reduce power dissipation. When high speed operation of the gate is required at the sacrifice of power dissipation, the second impedance should be of a lower value than the first-mentioned impedance.

In the fabrication of the logic circuit of the invention as a semiconductor integrated circuit, the Schottky barrier diode is formed in the collector region of the transistor. Moreover, the base region of the transistor may be utilized as a resistor to provide the first-mentioned impedance element. Thus, a simple, low-power logic gate circuit with a minimum number of circuit elements can be realized within only one or two isolated areas formed in the semiconductor integrated circuit.

For a more complete understanding of these and other objects and features of this invention, reference will be made to the following description and the accompanying drawings, wherein.

Figure 1:
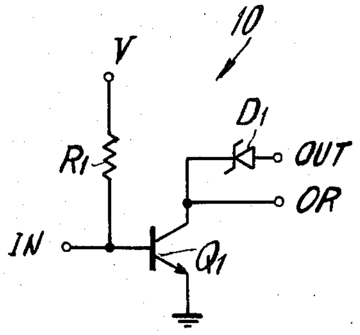
FIG. 1 is a schematic diagram of a basic logic gate circuit according to an embodiment of the invention.

Referring to FIG. 1, there is shown schematically the logic gate circuit according to one embodiment of the invention. As therein shown, the circuit, which is generally designated 10, includes a transistor $Q_1$ having a base electrode connected directly to an input terminal IN and to one end of a resistor $R_1$, the other end of which is connected to a power source terminal V. The emitter electrode of the transistor is connected to a reference source terminal (which is here shown as ground), and the collector electrode is connected through a Schottky barrier diode $D_1$ to an output terminal OUT. The polarity of the diode $D_1$ connected between the collector and the output terminal is selected such that current passes through the diode in the same direction as the collector current of the transistor $Q_1$.

The output terminal OUT is connected directly to an input terminal of a logic circuit similar to the circuit 10 in the next logic stage, and is thereby supplied with power from a power source terminal of the next stage circuit which corresponds to the terminal V of the circuit 10. If the circuit 10 is in a final stage, the output terminal OUT is connected to an appropriate power source through an impedance. The logic circuit 10 has another terminal OR which is directly connected to the collector of the transistor $Q_1$. This terminal OR may be connected, for example, to the corresponding terminal of another similar logic circuit in order that the collector potential of each transistor in each logic circuit is necessarily the same. An example of the use of the terminal OR will be described hereinafter with reference to FIG. 4.

If it is assumed that the input terminal IN of the logic circuit 10 in FIG. 1 is open or in such a state that it is connected to a high impedance, a current supplied through the resistor $R_1$ from the power source terminal V flows entirely toward the base electrode of the transistor $Q_1$, with the result that the transistor $Q_1$ is turned on. On the other hand, if the input terminal IN were fixed at a voltage lower than the base-to-emitter forward voltage $V_{BEQ1}$ of the transistor $Q_1$, the transistor $Q_1$ would be turned off. The voltage $V_{O(ON)}$ on the output terminal OUT when transistor $Q_1$ is turned on is given by:

$$V_{O(ON)} = V_{CE(SAT)Q_1} + V_{FD},$$

where $V_{CE(SAT)Q_1}$ denotes the collector-emitter saturation voltage of the transistor $Q_1$, and $V_{FD}$ denotes the voltage of the Schottky barrier diode $D_1$. Since $V_{BE}$ is about 0.8 volt and $V_{CE(SAT)}$ is approximately equal to 0.1 volt with ordinary transistors, and $V_{FD}$ is approximately equal to 0.4 volt with ordinary Schottky barrier diodes, the following relationship is always formed:

$$V_{O(ON)} < V_{BEQ}$$

Where a plurality of logic gates 10 according to this invention are connected in cascade, an output voltage of a former stage becomes an input signal of a succeeding stage. Therefore, when the transistor $Q_1$ of the former stage is on, $V_{O(ON)}$ becomes an input signal of the logic gate of the next stage, thereby turning the latter logic gate off. When the logic gate of the former stage is off, its output terminal OUT, or the input terminal of the next logic gate, is in such a state that a high impedance is connected thereto, whereby the next logic gate is turned on. If the voltage $V_{O(ON)}$ and the off state are respectively taken as level 0 and level 1, it is readily understood that each logic gate in the cascade connection operates as an inverter.

Figure 2:
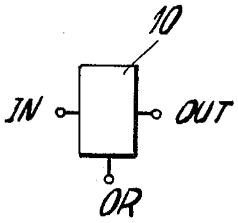
FIG. 2 is a simplified representation of the logic gate circuit shown in FIG. 1 representing its function.
Figure 3:
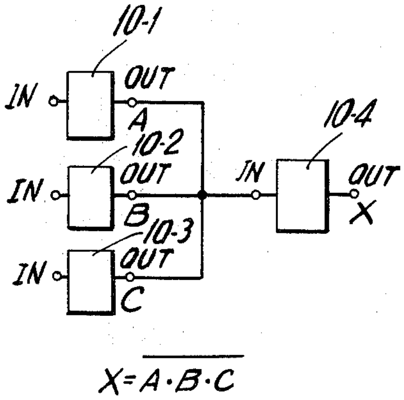
FIG. 3 is a diagram illustrating how a NAND function can be achieved by the use of a plurality of the logic gate circuits of this invention.

FIG. 2 is a simplified representation of the logic gate circuit 10 of FIG. 1. Referring to FIG. 3, which shows a combination of four identical logic gates 10-1 to 10-4, each of which is indicated by the simplified representation indicated in FIG. 2, it is seen that the output terminals out the three gates 10-1 to 10-3 are tied together and connected to the input terminal IN of the logic gate 10-4 of the next stage. In FIG. 3, A, B and C respectively denote the outputs of the logic gates 10-1 to 10-3 as represented in a binary state, whereas X denotes the output of the gate 10-4, also as represented in a binary state. With this interconnection, the output X becomes level 0 only when all outputs A, B and C of the three gates 10-1 to 10-3 of the preceding stage are at level 1. In other words, a NAND function, or $X = \overline{A \cdot B \cdot C}$, is realized by the interconnection shown in FIG. 3.

Figure 4:
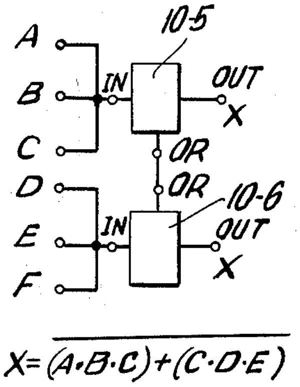
FIG. 4 is a diagram illustrating how an AND-NOR function can be achieved by the use of a plurality of the logic gate circuits of this invention.

It is also possible to perform an AND-NOR function by tying together two OR terminals of two identical logic gates 10-5 and 10-6 of the invention as shown in FIG. 4. In this case the collector voltages of the transistors in the two logic gates 10-5 and 10-6 are made equal to each other, and hence the outputs X of the two gates 10-5 and 10-6 become equal.

Figure 5:
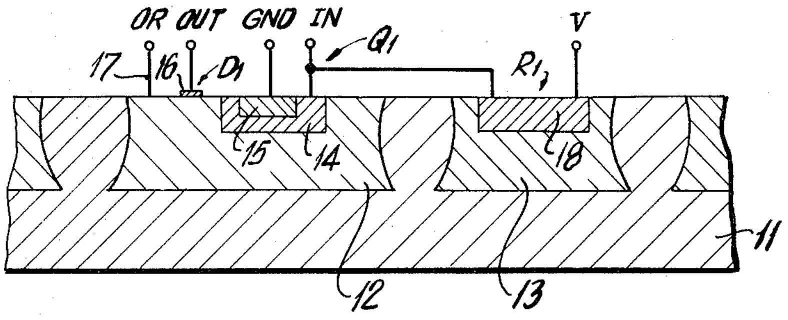
FIG. 5 is a cross-sectional view of a semiconductor integrated circuit for realizing the basic logic circuit of FIG. 1.

Referring now to FIG. 5, a description will be made of how the logic gate circuit 10 of FIG. 1 may be practically realized as a semiconductor integrated circuit. As shown, a semiconductor substrate 11 of, for example, p-type silicon, has formed therein n-type regions 12 and 13 which are isolated from the substrate 11 and from each other by p-n junctions. In the n-type isolated region 12, which in this case acts as the collector of a transistor $Q_1$, a p-type base region 14 and an n-type emitter region 15 are successively formed.

It is known that the Schottky barrier can easily be formed on a weakly doped collector region with integrated circuitry. It is possible, therefore, to form a Schottky barrier diode $D_1$ by attaching a metal electrode 16 onto the surface of the collector region 12. The metal electrode 16 is formed of a material such as molybdenum capable of producing the Schottky barrier with n-type silicon. On the surface of the collector region 12, another electrode 17 is attached which makes ohmic contact with the collector region. The Schottky electrode 16 is made the output terminal OUT, and the ohmic electrode 17 is made the OR terminal. Ohmic contacts are also provided on the base and the emitter regions 14 and 15, respectively. The base contact is used as the input terminal IN and the emitter contact is connected to the ground GND.

A p-type elongated region 18 is formed in the other isolated region 13 and is used as the resistor $R_1$. Ohmic contacts are provided at both ends of region 18, one of which is used as a power source terminal V and the other is connected to the base region 14. Since the logic gate circuit 10 of FIG. 1 is formed, as shown in FIG. 5, within two isolated regions 12 and 13, the circuit density of the integrated circuit can be markedly improved.

Figure 6:
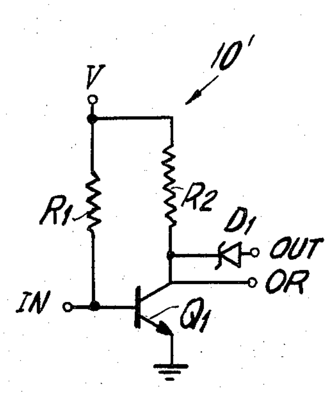
FIG. 6 is a schematic diagram of a basic logic circuit according to another embodiment of the invention.

The logic gate circuit 10' illustrated schematically in FIG. 6 is similar to that of FIG. 1 but has an additional resistor $R_2$ connected between the collector of the transistor $Q_1$ and the power source terminal V. Resistor $R_2$, which is of a greater value of resistance than resistor $R_1$, acts as a pull-up resistance for elevating the output voltage when the transistor $Q_1$ is turned off. Therefore, the addition of the resistor $R_2$ does not adversely affect the operation of the logic circuit 10 of FIG. 1. Although the addition of the resistor $R_2$ increases the noise margin in the logic operation, the power consumption of the logic gate inevitably increases.

Figure 7:
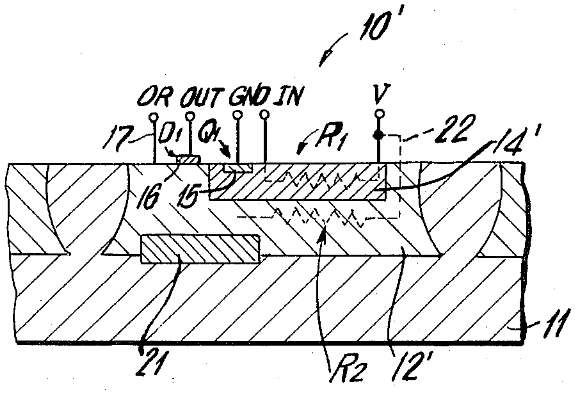
FIG. 7 is a cross-sectional view of a semiconductor integrated circuit for realizing the basic logic circuit of FIG. 6.

FIG. 7 is an integrated circuit structure for realizing the logic circuit 10' of FIG. 6, and is comparable to the integrated circuit shown in FIG. 5, except that the base region 14 in FIG. 5 is extended and utilized as a resistance and the logic gate circuit is formed within a single isolated region 12'. In FIG. 7, the same portions are indicated by the same reference numerals as in FIG. 5.

Stated more specifically, the length of the isolated region 12' in FIG. 7 is extended beyond that of the region 12 in FIG. 5, and an elongated base region 14' is formed therein. In one end of the base region 14', an emitter region 15 is formed and a base contact for the input terminal IN is provided near the emitter region. Another contact for the power source terminal V is provided on the other end of the base region 14', whereby a part of the base region 14' lying between the two terminals IN and V acts as the resistor $R_1$.

Resistor $R_2$ of the circuit of FIG. 6 is realized in the semiconductor LSI circuit of FIG. 7 by the extended part of collector region 12' lying beneath the resistor part of the base region 14'. Since the sheet resistance of the collector region is much higher than that of the base region, resistor $R_2$ is substantially higher than resistor $R_1$.

An n+ type buried layer 21 may be formed selectively in the collector region 12' under the emitter region 15 and the Schottky diode $D_1$ in order to secure the operation of the transistor $Q_1$. Where the connection 22 is present between the power source terminal V and a part of the collector region 12' remote to those parts thereof at which the Schottky electrode 16 and the ohmic electrode 17 are provided, the integrated circuit structure of FIG. 7 realizes a logic gate circuit 10' shown in FIG. 6. Where connection 22 is not present, the integrated circuit structure of FIG. 7 realizes the logic gate circuit 10 of FIG. 1. It will be apparent that the logic gate circuit 10' of FIG. 6 can be realized by other structures than that shown in FIG. 7.

Figure 8:
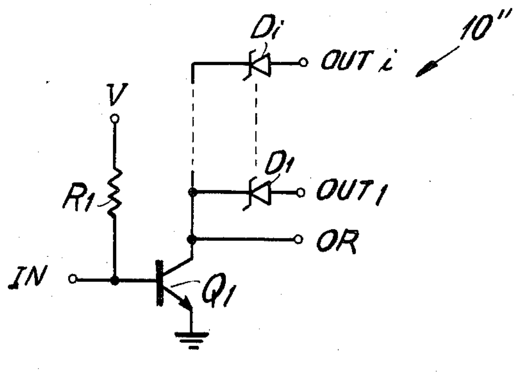
FIG. 8 is a schematic diagram of the basic logic circuit of the invention having a plurality of output terminals.

If it is desired to have a plurality of output terminals in the logic gate of this invention, a plurality of Schottky barrier diodes $D_1$ and $D_i$ are connected in parallel to the collector of the transistor $Q_1$, and the other ends of the diodes $D_1$ to $D_i$ are used as output terminals $OUT_1$ and $OUT_i$, as shown in FIG. 8.

The logic gate circuit according to this invention has a great deal of practical utility as viewed from the standpoint of integrated circuitry in that both the number of circuit elements and the area occupied thereby are reduced. Thus, the present invention makes a great contribution toward further miniaturization and higher yield, particularly when applied to LSI logic circuits.

Although the present invention has been herein specifically described with respect to preferred embodiments, it will be apparent that modifications may be made thereto, all without departing from the spirit and scope of the invention.

I claim:

1. A logic circuit having first and second logic circuits both formed in a single P-type semiconductor substrate; each of said first and second logic circuits comprising an NPN transistor, a plurality of Schottky barrier diodes each connected to said transistor collector terminal, a first impedance element, an input terminal connected to said transistor base, and a plurality of output terminals, an N-type collector region of said NPN transistor being formed in the upper surface of said substrate, an elongated P-type base region of said NPN transistor being formed in said collector region, an N-type emitter region of said NPN transistor being formed at one end of said elongated base region therein, each of said plurality of said Schottky barrier diodes including a metal electrode attached to the surface of said collector region near said one end of said base region, said impedance element being defined by the part of said elongated base region lying between said emitter region and the other end of said elongated base region, said input terminal including an ohmic contact attached to said one end of said elongated base region, a plurality of said output terminals being connected to said respective metal electrodes, and a voltage source connected between said other end of said elongated base region and said emitter region, one of a plurality of said output terminals of said first logic circuit being connected to said input terminal of said second logic circuit.

2. The logic circuit of claim 1, in which each of said first and second logic circuits further comprises a second impedance element, said second impedance element being defined by a part of said collector region underlying said part of said elongated base region, and said other end of said elongated base region being connected to a part of said collector region remote from the part thereof at which said Schottky barrier diodes are formed.

3. The logic circuit of claim 1, further comprising a buried N-type layer formed at the junction of said collector region and said substrate and under said metal electrodes of said Schottky barrier diodes and said emitter region.

* * * * *